(12) United States Patent
Yoo et al.

(10) Patent No.: US 8,893,618 B2
(45) Date of Patent: Nov. 25, 2014

(54) PATTERNING METHOD AND METHOD FOR MANUFACTURING LIQUID CRYSTAL DISPLAY DEVICE USING THE SAME

(75) Inventors: Hong Suk Yoo, Gunpo-si (KR); Chul Ho Kim, Incheon-si (KR); Jung Jae Lee, Gwacheon-si (KR); Tae Young Oh, Anyang-si (KR); Choon Ho Park, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 676 days.

(21) Appl. No.: 11/477,439

(22) Filed: Jun. 30, 2006

(65) Prior Publication Data
US 2007/0157841 A1    Jul. 12, 2007

(30) Foreign Application Priority Data

Dec. 29, 2005  (KR) ........................ 10-2005-0134118

(51) Int. Cl.
| | |
|---|---|
| B41F 9/01 | (2006.01) |
| H05K 3/12 | (2006.01) |
| G02B 5/20 | (2006.01) |
| G02B 5/22 | (2006.01) |
| G02F 1/1335 | (2006.01) |
| H05K 3/20 | (2006.01) |

(52) U.S. Cl.
CPC .............. *H05K 3/1275* (2013.01); *G02B 5/201* (2013.01); *G02B 5/223* (2013.01); *G02F 1/133516* (2013.01); *H05K 3/207* (2013.01); *G02F 1/133512* (2013.01); *H05K 3/125* (2013.01); *H05K 2203/0113* (2013.01); *H05K 2203/013* (2013.01); *H05K 2203/0143* (2013.01); *H05K 2203/0534* (2013.01); *H05K 2203/1173* (2013.01)

USPC ........................... 101/492; 101/170; 347/103

(58) Field of Classification Search
CPC ............. G02F 1/133516; H05K 3/125; H05K 3/1275; H05K 2203/013; H05K 2203/0534
USPC .............. 101/327, 368, 463.1, 170, 491, 492; 349/187

See application file for complete search history.

(56) References Cited

U.S. PATENT DOCUMENTS

| | | | |
|---|---|---|---|
| 5,635,006 A * | 6/1997 | Watanabe et al. .............. 156/240 |
| 6,234,608 B1 * | 5/2001 | Genovese et al. ................ 347/54 |
| 6,358,602 B1 * | 3/2002 | Horiuchi et al. ............... 428/323 |
| 6,690,448 B2 * | 2/2004 | Kawase et al. ................. 349/187 |
| 7,015,503 B2 * | 3/2006 | Seki et al. ......................... 257/40 |
| 2003/0047535 A1 * | 3/2003 | Schueller et al. ................ 216/41 |
| 2003/0124865 A1 | 7/2003 | Baek et al. |

(Continued)

FOREIGN PATENT DOCUMENTS

| CN | 1258428 A | 6/2000 |
|---|---|---|
| CN | 1508598 A | 6/2004 |

(Continued)

*Primary Examiner* — Jill Culler
*Assistant Examiner* — Justin Olamit
(74) *Attorney, Agent, or Firm* — McKenna Long & Aldridge LLP

(57) ABSTRACT

A patterning method and a method for manufacturing an LCD device using the same are disclosed. The patterning method includes preparing a printing plate having concave and convex portions; coating a pattern material in the concave portion of the printing plate; rolling a printing roller on the printing plate to print the pattern material of the concave portion on the printing roller; and rolling the printing roller on a substrate to print the pattern material of the printing roller on the substrate.

6 Claims, 6 Drawing Sheets

(56) References Cited

U.S. PATENT DOCUMENTS

| | | |
|---|---|---|
| 2004/0119935 A1 | 6/2004 | Baek et al. |
| 2004/0126678 A1 | 7/2004 | Bael et al. |
| 2004/0127135 A1* | 7/2004 | Baek et al. .............. 445/24 |
| 2004/0201048 A1* | 10/2004 | Seki et al. ............... 257/294 |
| 2005/0042320 A1 | 2/2005 | Hasei |
| 2006/0054086 A1* | 3/2006 | Takamura ............... 118/708 |
| 2006/0068319 A1* | 3/2006 | Andriessen et al. ....... 430/270.1 |
| 2006/0090660 A1* | 5/2006 | Oh ........................... 101/375 |

FOREIGN PATENT DOCUMENTS

| | | |
|---|---|---|
| CN | 1573493 A | 2/2005 |
| CN | 1693955 A | 9/2005 |
| JP | 6-186416 A | 7/1994 |
| JP | 06-302598 | 10/1994 |
| JP | 10-095178 | 4/1996 |
| JP | 2000-335073 A | 12/2000 |
| JP | 2001-286813 A | 10/2001 |
| JP | 2002-189121 A | 7/2002 |
| JP | 2003-195024 | 7/2003 |
| JP | 2004-029831 A | 1/2004 |
| JP | 2004-212814 A | 7/2004 |
| JP | 2004-212925 A | 7/2004 |
| JP | 2005-043678 | 2/2005 |
| JP | 2005-115000 | 4/2005 |
| KR | 10-2001-0012686 A | 2/2001 |
| KR | 10-2004-059101 A | 7/2004 |
| WO | WO 2007/120877 A2 | 10/2007 |

* cited by examiner

PATTERNING METHOD AND METHOD FOR MANUFACTURING LIQUID CRYSTAL DISPLAY DEVICE USING THE SAME

This application claims the benefit of Korean Patent Application No. P2005-134118, filed on Dec. 29, 2005, which is hereby incorporated by reference for all purposes as if fully set forth herein.

BACKGROUND OF THE INVENTION

1. Field of the Invention

The present invention relates to liquid crystal display (LCD) devices, and more particularly, to a patterning method for an LCD device.

2. Discussion of the Related Art

Among various ultra-thin flat type display devices, which include a display screen having a thickness of no more than several centimeters, liquid crystal display (LCD) devices are widely used for notebook computers, monitors, aircraft, etc. because they have advantages such as low power consumption and portability.

An LCD device includes lower and upper substrates facing each other at a predetermined interval therebetween, and a liquid crystal layer formed between the lower and upper substrates.

The lower substrate includes a gate line, a data line, and a thin film transistor. The gate line is formed perpendicular to the data line to define a unit pixel region. The thin film transistor is formed adjacent to a crossing of the gate and data lines and serves as a switching device. A pixel electrode is connected to the thin film transistor.

The upper substrate includes a black matrix layer for shielding the gate line, the data line and the thin film transistor from light, a color filter layer formed on the black matrix layer, and a common electrode formed on the color filter layer.

The above-described LCD device includes various elements formed by repeated steps. Photolithography may be used to form the elements in various shapes.

A patterning method using a photolithographic process of the related art will be described with reference to FIGS. 1A to 1C.

FIGS. 1A to 1C are cross sectional views illustrating a patterning method using a photolithography of the related art.

As shown in FIG. 1A, a pattern material layer 20 is formed on a substrate 10, and a layer of photoresist 21 is formed on the pattern material layer 20.

As shown in FIG. 1B, a mask 30 with a predetermined pattern is positioned above the photoresist layer 21, and then light is provided to the substrate 10 by an exposure apparatus.

As shown in FIG. 1C, the photoresist layer 21 is patterned using a development process. The pattern material layer 20 is etched using the patterned photoresist layer 21 as a mask, to obtain a desired pattern 20a.

The above photolithographic process uses a photoresist layer and a mask with the predetermined pattern that increases the manufacturing cost for an LCD device. In addition, photolithography requires exposure and development, which are complicated processes that increase the manufacturing time of LCD devices.

To overcome these problems associated with photolithography, new patterning methods has been developed using a printing method using a printing roller.

A patterning method using a printing roller according to the related art will be described with reference to the FIGS. 2A to 2D.

FIGS. 2A to 2D are cross sectional views illustrating a process for forming a pattern material layer on a substrate with a printing roller according to the related art.

As shown in FIG. 2A, a pattern material 20 is coated onto a printing plate 40 having recesses and lands.

As shown in FIG. 2B, a blade 35 is used to remove pattern material 20b from the surface of the printing plate 40, leaving pattern material 20a in the recesses of the printing plate 40.

As shown in FIG. 2C, a printing roller 50 is rolled across the printing plate 40. The pattern material 20a remaining in the recesses is printed onto the printing roller 50, forming a predetermined pattern on the printing roller 50.

Referring to FIG. 2D, by rolling the printing roller 50 having the pattern material 20a coated thereonto on a substrate 10, the pattern material 20a of the printing roller 50 is printed onto the substrate 10.

The patterning method using the printing roller and the printing plate does not require a mask having a predetermined pattern, and does not require exposure or development processes, thereby decreasing the manufacturing cost and time.

However, the patterning method using the printing roller according to the related art has the following disadvantages.

In the pattering method using the printing roller and the printing plate according to the related art, as shown in FIG. 2B, the pattern material 20 is coated onto the printing plate 40, and the pattern material 20b is removed from the surface of the printing plate using a blade 35 to leave the pattern material only in the recesses of the printing plate 40. The removal of pattern material 20b from the surface of the printing plate may be incomplete, leaving residue in the portions of the printing plate other than the recesses. The pattern material left in the recesses may be non-uniform. Further, applying the pattern material 20b to the printing plate and then removing portions of the pattern material from the printing plate increases manufacturing cost due to the waste of pattern material.

SUMMARY OF THE INVENTION

Accordingly, the present invention is directed to a patterning method and a method for manufacturing a liquid crystal display (LCD) device using the same that substantially obviates one or more of the problems due to limitations and disadvantages of the related art.

An advantage of the present invention is to provide a patterning method and a method for manufacturing an LCD device using the same, to improve the preciseness of printing, and to reduce cost and waste of material.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a patterning method includes: preparing a printing plate having recesses and lands; dropping a pattern material in the recesses of the printing plate; rolling a printing roller on the printing plate to print the pattern material in the recesses onto the printing roller; and rolling the printing roller on a substrate to print the pattern material on the printing roller onto the substrate.

In another aspect of the present invention, a method for manufacturing an LCD device includes: preparing first and second printing plates having concave and convex portions; coating a black matrix material in the concave portion of the first printing plate; rolling a first printing roller on the first printing plate to print the black matrix material on the first printing roller; forming a black matrix layer on a substrate by rolling the first printing roller on the substrate to print the black matrix material on the substrate; coating a color filter material in the concave portion of the second printing plate; rolling a second printing roller on the second printing plate to print the color filter material of the concave portion on the second printing roller; and forming a color filter layer on the substrate including the black matrix layer by rolling the second printing roller on the substrate including the black matrix layer to print the color filter material on the substrate including black matrix layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Hereinafter, a patterning method and a method for manufacturing an LCD device according to the present invention will be described with reference to the FIGS. 3A to 3D.

FIGS. 3A to 3D are cross sectional views illustrating a patterning method according to a first embodiment of the present invention.

In the patterning method according to the first embodiment of the present invention, a predetermined material layer is formed on a predetermined portion of a substrate excluding a pattern area, and a hydrophobic material is coated on a surface of the predetermined material layer. A pattern material layer is formed on the substrate excluding the predetermined material layer using an ink-jet method, whereby the pattern material layer is printed on a printing roller. For example, the predetermined material layer may be formed of a black matrix layer.

Figure 1A:
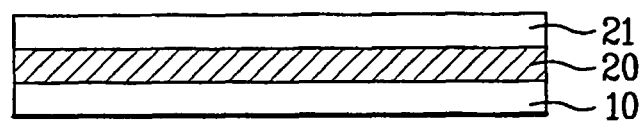
FIGS. 1A, 1B, and 1C are cross sectional views illustrating a patterning method using a photolithography of the related art.
Figure 1B:
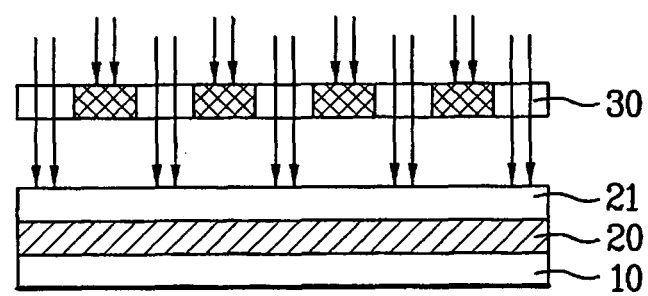
Figure 1C:
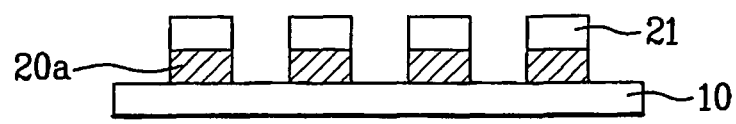
Figure 2A:
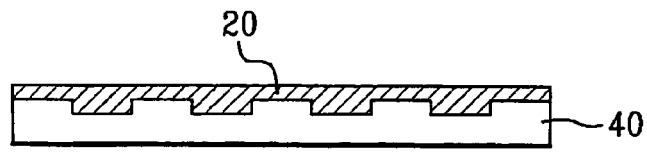
FIGS. 2A, 2B, 2C, and 2D are cross sectional views illustrating a patterning method using a printing roller according to the related art.
Figure 2B:
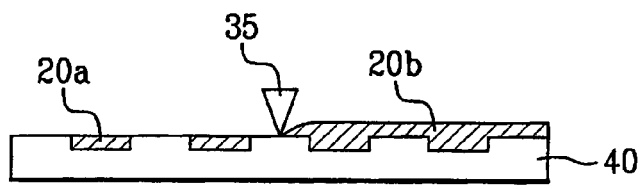
Figure 2C:
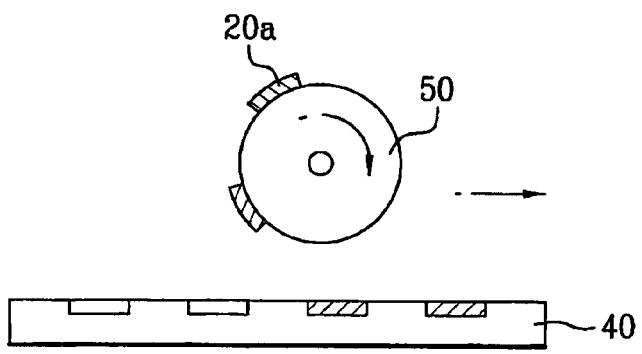
Figure 2D:
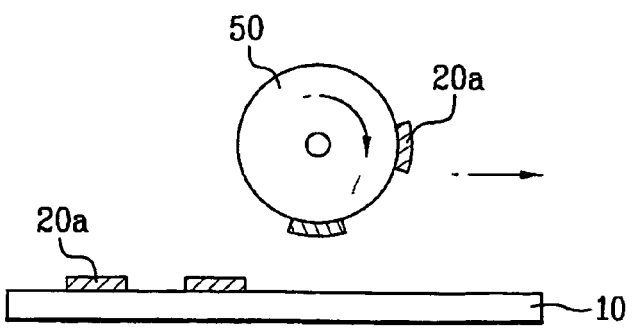
Figure 3A:
FIGS. 3A, 3B, 3C, and 3D are cross sectional views illustrating a patterning method according to the first embodiment of the present invention.

As shown in FIG. 3A, the black matrix layer 230 is formed on a hydrophilic substrate 100 excluding the pattern area. The black matrix layer 230 may be formed using photolithography.

Figure 3B:
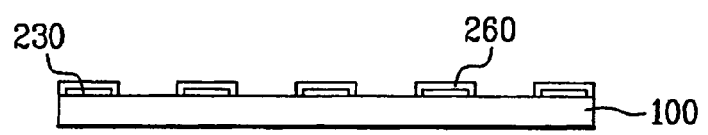

As shown in FIG. 3B, a hydrophobic treatment is applied to the surface of the black matrix layer 230, to thereby form a hydrophobic layer 260 to form a printing plate having the black matrix layer 230 and the hydrophobic layer 260 is prepared.

The pattern material layer is a hydrophilic material. That is, if the hydrophobic layer 260 were not formed on the surface of the black matrix layer 230, the pattern material layer would permeate into the black matrix layer 230, and the printed pattern material would not be precisely formed for printing the pattern material on the printing roller. Forming the hydrophobic layer 260 on the surface of the black matrix layer 230 prevents the permeation of the pattern material layer into the black matrix layer.

Figure 3C:
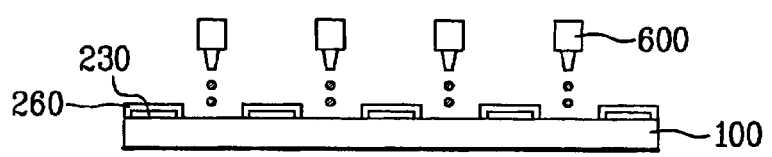

As shown in FIG. 3C, a pattern material is dropped onto the substrate 100 corresponding to the pattern area, that is, the portion of the substrate having no black matrix layer 230, using a precision nozzle 600.

Figure 3D:
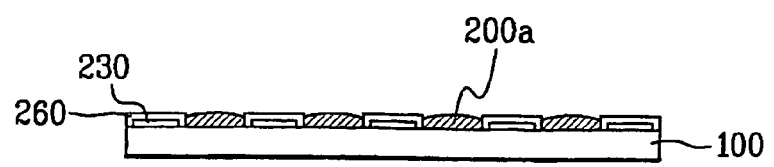

After dropping an appropriate amount of the pattern material as shown in FIG. 3D, the pattern material is printed on the printing roller by rolling the printing roller on the printing plate. The pattern material is then printed onto a substrate for an LCD device by rolling the printing roller on an LCD substrate.

By forming the pattern using an ink-jet method employing a precision nozzle, it is possible to decrease the consumption of pattern material.

In the above description of the embodiment illustrated in FIGS. 3A to 3D, the predetermined material layer 230 is described as being a hydrophilic, black matrix pattern material, while the pattern material is described as also hydrophilic. However, the predetermined material and the pattern material may have other combinations of hydrophobic and hydrophilic properties. When the predetermined material layer 230 and the pattern material have opposite properties, for example, when the predetermined material layer is hydrophobic while the pattern material is hydrophilic is hydrophilic, the hydrophobic layer 260 may be omitted. However, when the pattern material and the predetermined material layer have the same property, that is when both are either hydrophobic or hydrophilic, the layer 260 is chosen to have the opposite property from the pattern material and the predetermined material. For example, when the pattern material and the predetermined material 230 are both hydrophobic, the hydrophobic layer 260 described above is replaced with a hydrophilic layer.

Alternatively, a recess may be formed in a glass substrate without forming a black-matrix layer, and a pattern material may be dropped in the recess of the glass substrate to form a desired pattern. This method will be explained in detail with reference to FIGS. 4A to 4D.

FIGS. 4A to 4D are cross sectional views of illustrating a patterning method according to a second embodiment of the present invention.

Figure 4A:
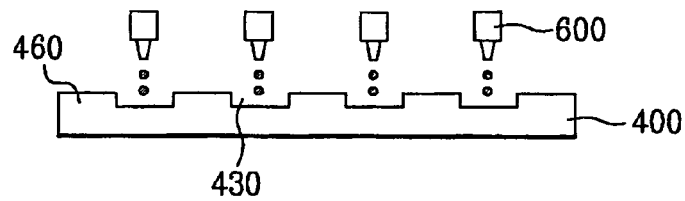
FIGS. 4A, 4B, 4C, and 4D are cross sectional views illustrating a patterning method according to the second embodiment of the present invention.

As shown in FIG. 4A, a printing plate 400 having recesses 430 and lands 460 is prepared. The printing plate 400 may be formed from a glass, organic or inorganic material.

The bottom of a recess 430 formed in the printing plate 400 may be hydrophilic. By forming printing plate 400 of material having a strong hydrophilic property, performing an additional hydrophilic treatment to the bottom of the recess 430 of the printing plate 400 may be avoided. However, if the printing plate 400 is formed of a hydroxyl-based or carbonyl-based organic material, a hydrophilic treatment using oxygen plasma may be applied to the bottom of a recess 430 of the printing plate 400.

When the bottom of the recesses 430 of the printing plate 400 have a strong hydrophilic property, the pattern material effectively spreads over the bottom of the recesses 430.

The printing plate 400 has lands 460 to which a hydrophobic treatment may be applied. Alternatively, the printing plate 400 may be formed of a material having a strong hydrophilic property. When the lands 460 of the printing plate 400 have a strong hydrophobic property, coating of the pattern material onto the upper surface of the lands 460 may be prevented.

The hydrophobic treatment may include treating the lands 460 of the printing plate 400 with fluoric carbon $CF_4$ plasma.

The pattern material is dropped into a recess of the printing plate using at least one precision nozzle 600. When using one precision nozzle 600, the precision nozzle 600 is moved to each recess 430. When using a plurality of precision nozzles, it is possible to decrease the process time by reducing or eliminating motion of the precision nozzles 600.

The pattern material is dropped only in the recesses 430 and coats only the recesses of the printing plate 400. Accordingly, a residue may be avoided reducing material costs and manufacturing costs.

The printing plate 400 can be reused reducing the processes used for forming a complicated pattern.

Figure 4B:
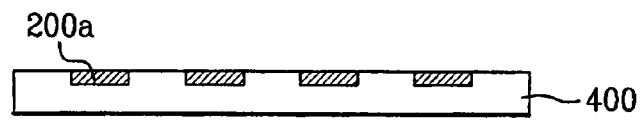
Figure 4C:
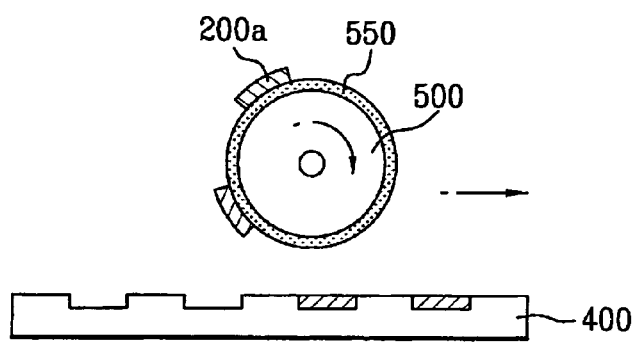

After dropping the appropriate amount of pattern material 200a in a recess 430 using the precision nozzle 600 as shown in FIG. 4B, a printing roller 500 is rolled on the printing plate 400, as shown in FIG. 4C. The pattern material 200a from the recess 430 of the printing plate 400 is printed on the surface of the printing roller 500, whereby the pattern material 200a having the predetermined pattern is formed on the printing roller 500.

A blanket 550 of Si-based resin is formed on the surface of the printing roller 500. The blanket 550 of Si-based resin has elasticity to decrease friction between the printing roller 500 and the printing plate 400, and between the printing roller 500 and a substrate 100.

Figure 4D:
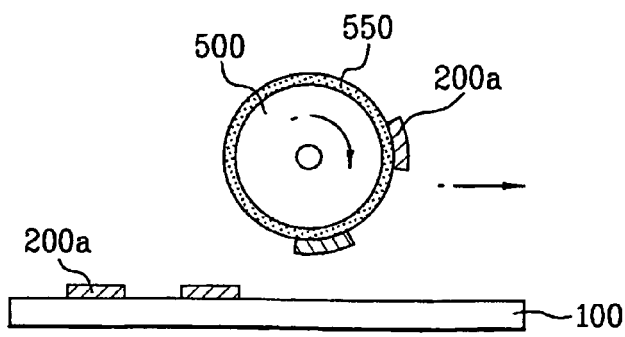

As shown in FIG. 4D, by rolling the printing roller 500 on the substrate 100, the pattern material 200a is printed on the substrate 100, forming the pattern material 200a in the predetermined pattern on the substrate 100.

In the above description of the embodiment illustrated in FIGS. 4A to 4D, the pattern material is described as being hydrophilic, while the lands of the printing plate are hydrophobic and the recesses of the printing plate are hydrophilic. Alternatively, a hydrophobic pattern material may be used in which case the lands of the printing plate are hydrophilic, and the recesses of the printing plate are hydrophobic. If the printing plate is made of a hydrophobic material, the lands of the printing plate may be made hydrophilic by treatment such as a treatment with an oxygen plasma. If the printing plate is made of a hydrophilic material, the recesses of the printing plate may be made hydrophobic by treatment such as a treatment with a fluoric carbon plasma.

Figure 6A:
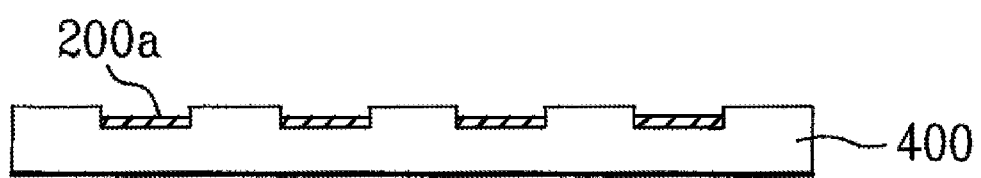
FIGS. 6A and 6B are cross sectional view illustrating an another method for manufacturing an LCD device according to the present invention.
Figure 6B:
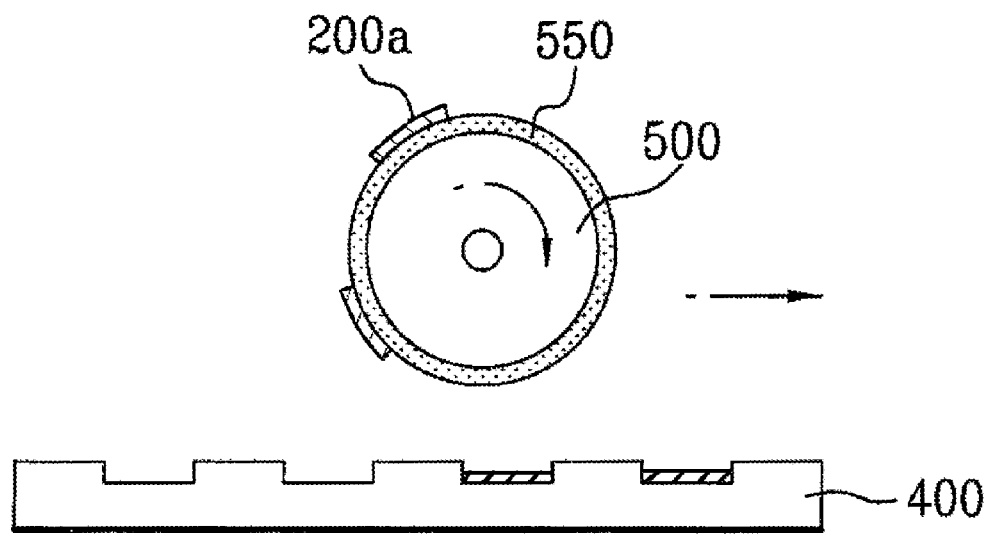

In the above-described embodiment, the pattern material is prevented from coating the lands of the printing plate by controlling a hydrophobic or hydrophilic property of the lands to be opposite that of the pattern material. Alternatively, the depth of the pattern material in the recesses may be controlled during dropping of the pattern material to prevent coating of the lands of the printing plate, as illustrated in FIGS. 6A and 6B. The printing plate 400 has a recess depth measured from the bottom of a recess 430 adjacent to the surface of an adjacent land 460. When dropping the pattern material into the recess 430 using the precision nozzle 600, the precision nozzle is controlled to form a height of pattern material in the recess based on the feature to be printed. As shown in FIGS. 6A and 6B, the height of the printed material in the recess is less than the height of the recess depth, leaving a recess gap having an effective height measured from the surface of the printed material in the recess 430 to the surface of an adjacent land 460 for preventing coating of the lands with pattern material. The effective height of the gap may be equal or greater than the height of the printed material in the recess in which case the depth of the recess is at least twice the height of the pattern material in the recess. For example, when forming a color filter, the precision nozzle may be controlled to form a height of color filter material in the recess of about 3 μm. The recess depth of the printing plate may be 6 μm or greater leaving an effective recess gap of at least 3 μm. The depth of the recess may be limited to 30 μm.

The above-described patterning method may be applied in a manufacturing process for an LCD device. In particular, the above patterning method may be used in forming a black matrix layer and a color filter layer of an LCD device.

FIGS. 5A to 5D are cross sectional views of illustrating a method for manufacturing an LCD device according to the present invention.

Figure 5A:
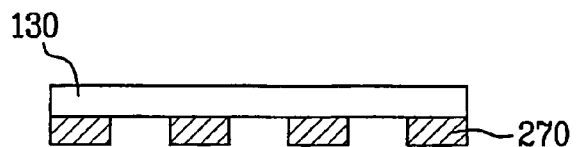
FIGS. 5A, 5B, 5C, and 5D are cross sectional views illustrating a method for manufacturing an LCD device according to the present invention.

As shown in FIG. 5A, a black matrix layer 270 is formed on a first substrate 130. That is, as shown in FIGS. 3C, 4A and 4B, a black matrix material is formed in the recesses 430 of the printing plate 400 by using the precision nozzle 600. As described above, the printing roller 500 is rolled on the printing plate 400 and the black matrix material formed in the recesses 430 of the printing plate 400 is printed on the surface of the printing roller 500. The printing roller 500 is then rolled on the first substrate 13, printing the black matrix material onto the first substrate 130 to form the black matrix layer 270.

Figure 5B:
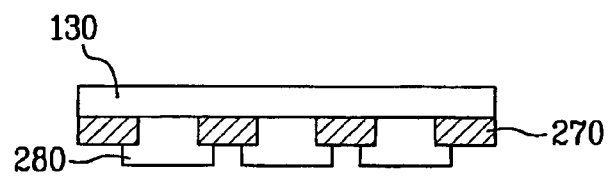

R, G, and B color filter materials are formed in respective recesses 430 of a second printing plate 400 using the precision nozzle 600. As shown in FIG. 5B, respective color filter layer patterns 280 are formed in corresponding recesses of the first substrate 130 having the black matrix layer 270, by rolling a second roller 500 on the second printing plate 400 and then rolling the second printing roller 500 on the first substrate 130.

Figure 5C:

As shown in FIG. 5C, a second substrate 160 having a thin film transistor array substrate is prepared.

Although not shown, a process for preparing the second substrate 160 includes forming gate and data lines crossing each other to define a pixel region, forming a thin film transistor formed adjacent to a crossing of the gate and data lines, forming a passivation layer on an entire surface including the thin film transistor, and forming a pixel electrode connected to a drain electrode of the thin film transistor.

Figure 5D:
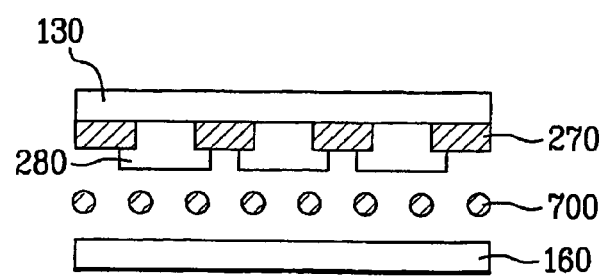

As shown in FIG. 5D, the first and second substrates 130 and 160 are bonded to each other, and a liquid crystal layer 700 is formed between the first and second substrates 130 and 160.

The liquid crystal layer 700 may be formed using a dispensing method or an injection method.

When using the dispensing method, a sealant having no inlet is formed on any one of the first and second substrates 130 and 160, liquid crystal is dispensed on any one of the first and second substrates 130 and 160, and the two substrates are bonded to each other.

When using the injection method, after forming a sealant having an inlet on any one of the first and second substrates 130 and 160, liquid crystal is injected into a space between the first and second substrates 130 and 160 by capillary phenomenon and pressure difference.

As mentioned above, the patterning method and the method for manufacturing the LCD device according to embodiments of the present invention have the following advantages.

By preparing a printing plate having a recesses and coating the pattern material in the recesses of the printing plate using a precision nozzle, it is possible to reduce defects during printing. In addition, coating the pattern material only in the recesses of the printing plate decreases manufacturing cost by decreasing consumption of the pattern material.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalent.

What is claimed is:

1. A method for manufacturing an LCD device comprising:
   preparing a first substrate and a second substrate;
   forming a pattern on the first substrate; and
   forming a liquid crystal layer between the first and second substrates,
   wherein forming a pattern on the first substrate comprises:
   preparing a printing plate having recesses and lands;
   dropping a pattern material into the recesses of the printing plate using at least one precision nozzle to form the pattern material in the recesses of the printing plate,
   stopping said dropping a pattern material into the recesses before a height of the pattern material formed in each recess reaches one-half a depth of the recess in order to prevent coating of lands of the printing plate,
   rolling a printing roller on the printing plate to print the pattern material in a recess of the printing plate onto the printing roller, wherein the printing roller comprises a blanket of Si-based resin, having elasticity, adhered to a surface thereof; and
   rolling the printing roller on the first substrate to print the pattern material on the printing roller onto the first substrate.

2. The method for manufacturing an LCD device of claim 1, wherein the pattern material is one of a black matrix material and a color filter material.

3. The method for manufacturing an LCD device of claim 1, wherein preparing the printing plate having recesses and lands comprises:
   forming a predetermined material layer on the printing plate corresponding to the lands.

4. The method for manufacturing an LCD device of claim 3, wherein the predetermined material layer includes a black matrix layer.

5. The method for manufacturing an LCD device of claim 1, wherein the process of preparing the printing plate having recesses and lands comprises forming grooves in the printing plate corresponding to the recesses.

6. The patterning method of claim 5, wherein the process of preparing the printing plate having recesses and lands further comprises forming a predetermined material layer on the printing plate corresponding to the lands.

* * * * *